United States Patent
Lu

(10) Patent No.: US 9,036,400 B2
(45) Date of Patent: May 19, 2015

(54) METHOD AND STRUCTURE OF MONOLITHICALLY INTEGRATED IC AND RESISTIVE MEMORY USING IC FOUNDRY-COMPATIBLE PROCESSES

(71) Applicant: Crossbar, Inc., Santa Clara, CA (US)

(72) Inventor: Wei Lu, Ann Arbor, MI (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/072,657

(22) Filed: Nov. 5, 2013

(65) Prior Publication Data

US 2014/0054539 A1    Feb. 27, 2014

Related U.S. Application Data

(63) Continuation-in-part of application No. 13/725,331, filed on Dec. 21, 2012, now Pat. No. 8,750,019, which is a continuation-in-part of application No. 12/833,898, filed on Jul. 9, 2010, now Pat. No. 8,374,018.

(51) Int. Cl.
*G11C 11/00* (2006.01)
*H01L 27/24* (2006.01)
*G11C 13/00* (2006.01)
*H01L 45/00* (2006.01)

(52) U.S. Cl.
CPC ........ *H01L 27/2481* (2013.01); *G11C 13/0002* (2013.01); *G11C 2213/33* (2013.01); *G11C 2213/52* (2013.01); *H01L 27/2436* (2013.01); *H01L 27/2463* (2013.01);
(Continued)

(58) Field of Classification Search
USPC ......................................................... 365/148
See application file for complete search history.

(56) References Cited

U.S. PATENT DOCUMENTS

| 4,433,468 A | 2/1984 | Kawamata |
| 4,684,972 A | 8/1987 | Owen et al. |

(Continued)

FOREIGN PATENT DOCUMENTS

| EP | 2408035 A2 | 1/2012 |
| EP | 2405441 A1 | 11/2012 |

(Continued)

OTHER PUBLICATIONS

Office Action for U.S. Appl. No. 13/434,567, dated Feb. 6, 2014.
(Continued)

*Primary Examiner* — Son Mai
(74) *Attorney, Agent, or Firm* — Ogawa P.C.

(57) ABSTRACT

The present invention relates to integrating a resistive memory device on top of an IC substrate monolithically using IC-foundry compatible processes. A method for forming an integrated circuit includes receiving a semiconductor substrate having a CMOS IC device formed on a surface region, forming a dielectric layer overlying the CMOS IC device, forming first electrodes over the dielectric layer in a first direction, forming second electrodes over the first electrodes in along a second direction different from the first direction, and forming a two-terminal resistive memory cell at each intersection of the first electrodes and the second electrodes using foundry-compatible processes, including: forming a resistive switching material having a controllable resistance, disposing an interface material including p-doped polycrystalline silicon germanium—containing material between the resistive switching material and the first electrodes, and disposing an active metal material between the resistive switching material and the second electrodes.

20 Claims, 6 Drawing Sheets

(52) U.S. Cl.
CPC ......... *H01L 45/085* (2013.01); *H01L 45/1233* (2013.01); *H01L 45/1253* (2013.01); *H01L 45/148* (2013.01); *H01L 45/1608* (2013.01); *H01L 45/16* (2013.01); *H01L 45/1246* (2013.01); *H01L 45/165* (2013.01)

(56) References Cited

U.S. PATENT DOCUMENTS

| | | | |
|---|---|---|---|
| 4,741,601 A | 5/1988 | Saito | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A | 1/1997 | Freeman et al. | |
| 5,614,756 A | 3/1997 | Forouhi et al. | |
| 5,645,628 A | 7/1997 | Endo et al. | |
| 5,714,416 A | 2/1998 | Eichman et al. | |
| 5,751,012 A | 5/1998 | Wolstenholme et al. | |
| 5,840,608 A | 11/1998 | Chang | |
| 5,970,332 A | 10/1999 | Pruijmboom et al. | |
| 5,998,244 A | 12/1999 | Wolstenholme et al. | |
| 6,122,318 A | 9/2000 | Yamaguchi et al. | |
| 6,128,214 A | 10/2000 | Kuekes et al. | |
| 6,143,642 A | 11/2000 | Sur, Jr. et al. | |
| 6,180,998 B1 | 1/2001 | Crafts | |
| 6,259,116 B1 | 7/2001 | Shannon | |
| 6,291,836 B1 | 9/2001 | Kramer et al. | |
| 6,436,765 B1 | 8/2002 | Liou et al. | |
| 6,436,818 B1 | 8/2002 | Hu et al. | |
| 6,492,694 B2 | 12/2002 | Noble et al. | |
| 6,627,530 B2 | 9/2003 | Li et al. | |
| 6,762,474 B1 | 7/2004 | Mills, Jr. | |
| 6,768,157 B2 | 7/2004 | Krieger et al. | |
| 6,806,526 B2 | 10/2004 | Krieger et al. | |
| 6,815,286 B2 | 11/2004 | Krieger et al. | |
| 6,838,720 B2 | 1/2005 | Krieger et al. | |
| 6,848,012 B2 | 1/2005 | LeBlanc et al. | |
| 6,858,481 B2 | 2/2005 | Krieger et al. | |
| 6,858,482 B2 | 2/2005 | Gilton | |
| 6,864,127 B2 | 3/2005 | Yamazaki et al. | |
| 6,864,522 B2 | 3/2005 | Krieger et al. | |
| 6,881,994 B2 | 4/2005 | Lee et al. | |
| 6,927,430 B2 | 8/2005 | Hsu | |
| 6,939,787 B2 | 9/2005 | Ohtake et al. | |
| 6,946,719 B2 | 9/2005 | Petti et al. | |
| 7,020,006 B2 | 3/2006 | Chevallier et al. | |
| 7,023,093 B2 | 4/2006 | Canaperi et al. | |
| 7,026,702 B2 | 4/2006 | Krieger et al. | |
| 7,102,150 B2 | 9/2006 | Harshfield et al. | |
| 7,122,853 B1 | 10/2006 | Gaun et al. | |
| 7,187,577 B1 | 3/2007 | Wang et al. | |
| 7,221,599 B1 | 5/2007 | Gaun et al. | |
| 7,238,607 B2 | 7/2007 | Dunton et al. | |
| 7,254,053 B2 | 8/2007 | Krieger et al. | |
| 7,289,353 B2 | 10/2007 | Spitzer et al. | |
| 7,324,363 B2 | 1/2008 | Kerns et al. | |
| 7,365,411 B2 | 4/2008 | Campbell | |
| 7,405,418 B2 | 7/2008 | Happ et al. | |
| 7,426,128 B2 | 9/2008 | Scheuerlein | |
| 7,433,253 B2 | 10/2008 | Gogl et al. | |
| 7,474,000 B2 | 1/2009 | Scheuerlein et al. | |
| 7,479,650 B2 | 1/2009 | Gilton | |
| 7,499,355 B2 | 3/2009 | Scheuerlein et al. | |
| 7,521,705 B2 | 4/2009 | Liu | |
| 7,534,625 B2 | 5/2009 | Karpov et al. | |
| 7,541,252 B2 | 6/2009 | Eun et al. | |
| 7,550,380 B2 | 6/2009 | Elkins et al. | |
| 7,566,643 B2 | 7/2009 | Czubatyi et al. | |
| 7,606,059 B2 | 10/2009 | Toda | |
| 7,615,439 B1 | 11/2009 | Schricker et al. | |
| 7,629,198 B2 | 12/2009 | Kumar et al. | |
| 7,719,001 B2 | 5/2010 | Nomura et al. | |
| 7,728,318 B2 | 6/2010 | Raghuram et al. | |
| 7,729,158 B2 | 6/2010 | Toda et al. | |
| 7,749,805 B2 | 7/2010 | Pinnow et al. | |
| 7,772,581 B2 | 8/2010 | Lung | |
| 7,778,063 B2 | 8/2010 | Brubaker et al. | |
| 7,786,464 B2 | 8/2010 | Nirschl et al. | |
| 7,786,589 B2 | 8/2010 | Matsunaga et al. | |
| 7,824,956 B2 | 11/2010 | Schricker et al. | |
| 7,829,875 B2 | 11/2010 | Scheuerlein | |
| 7,835,170 B2 | 11/2010 | Bertin et al. | |
| 7,859,884 B2 | 12/2010 | Scheuerlein | |
| 7,875,871 B2 | 1/2011 | Kumar et al. | |
| 7,881,097 B2 | 2/2011 | Hosomi et al. | |
| 7,897,953 B2 | 3/2011 | Liu | |
| 7,898,838 B2 | 3/2011 | Chen et al. | |
| 7,920,412 B2 | 4/2011 | Hosotani et al. | |
| 7,924,138 B2 | 4/2011 | Kinoshita et al. | |
| 7,968,419 B2 | 6/2011 | Li et al. | |
| 7,972,897 B2 | 7/2011 | Kumar et al. | |
| 7,984,776 B2 | 7/2011 | Sastry et al. | |
| 8,004,882 B2 | 8/2011 | Katti et al. | |
| 8,018,760 B2 | 9/2011 | Muraoka et al. | |
| 8,021,897 B2 | 9/2011 | Sills et al. | |
| 8,045,364 B2 | 10/2011 | Schloss et al. | |
| 8,054,674 B2 | 11/2011 | Tamai et al. | |
| 8,067,815 B2 | 11/2011 | Chien et al. | |
| 8,071,972 B2 | 12/2011 | Lu et al. | |
| 8,084,830 B2 | 12/2011 | Kanno et al. | |
| 8,088,688 B1 | 1/2012 | Herner | |
| 8,097,874 B2 | 1/2012 | Venkatasamy et al. | |
| 8,102,698 B2 | 1/2012 | Scheuerlein | |
| 8,143,092 B2 | 3/2012 | Kumar et al. | |
| 8,144,498 B2 | 3/2012 | Kumar et al. | |
| 8,164,948 B2 | 4/2012 | Katti et al. | |
| 8,168,506 B2 | 5/2012 | Herner | |
| 8,183,553 B2 | 5/2012 | Phatak et al. | |
| 8,187,945 B2 | 5/2012 | Herner | |
| 8,198,144 B2 | 6/2012 | Herner | |
| 8,207,064 B2 | 6/2012 | Bandyopadhyay et al. | |
| 8,227,787 B2 | 7/2012 | Kumar et al. | |
| 8,231,998 B2 | 7/2012 | Sastry et al. | |
| 8,233,308 B2 | 7/2012 | Schricker et al. | |
| 8,237,146 B2 | 8/2012 | Kreupl et al. | |
| 8,258,020 B2 | 9/2012 | Herner | |
| 8,265,136 B2 | 9/2012 | Hong et al. | |
| 8,274,812 B2 | 9/2012 | Nazarian et al. | |
| 8,315,079 B2 | 11/2012 | Kuo et al. | |
| 8,320,160 B2 | 11/2012 | Nazarian | |
| 8,374,018 B2 | 2/2013 | Lu | |
| 8,385,100 B2 | 2/2013 | Kau et al. | |
| 8,394,670 B2 | 3/2013 | Herner | |
| 8,441,835 B2 * | 5/2013 | Jo et al. ................. | 365/148 |
| 8,467,227 B1 | 6/2013 | Jo | |
| 8,587,989 B2 * | 11/2013 | Manning et al. ......... | 365/151 |
| 8,658,476 B1 * | 2/2014 | Sun et al. ............... | 438/132 |
| 8,659,003 B2 | 2/2014 | Herner et al. | |
| 2003/0141565 A1 | 7/2003 | Hirose et al. | |
| 2003/0174574 A1 | 9/2003 | Perner et al. | |
| 2003/0206659 A1 | 11/2003 | Hamanaka | |
| 2004/0026682 A1 | 2/2004 | Jiang | |
| 2004/0170040 A1 | 9/2004 | Rinerson et al. | |
| 2005/0020510 A1 | 1/2005 | Benedict | |
| 2005/0029587 A1 | 2/2005 | Harshfield | |
| 2005/0041498 A1 | 2/2005 | Resta et al. | |
| 2005/0052915 A1 | 3/2005 | Herner et al. | |
| 2005/0062045 A1 | 3/2005 | Bhattacharyya | |
| 2005/0073881 A1 | 4/2005 | Tran et al. | |
| 2005/0175099 A1 | 8/2005 | Sarkijarvi et al. | |
| 2006/0017488 A1 | 1/2006 | Hsu | |
| 2006/0281244 A1 | 12/2006 | Ichige et al. | |
| 2007/0008773 A1 | 1/2007 | Scheuerlein | |
| 2007/0015348 A1 | 1/2007 | Hsu et al. | |
| 2007/0045615 A1 | 3/2007 | Cho et al. | |
| 2007/0087508 A1 | 4/2007 | Herner | |
| 2007/0090425 A1 | 4/2007 | Kumar et al. | |
| 2007/0091685 A1 | 4/2007 | Guterman et al. | |
| 2007/0105284 A1 | 5/2007 | Herner | |

(56) References Cited

U.S. PATENT DOCUMENTS

| | | |
|---|---|---|
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1* | 5/2012 | Herner .......................... 438/382 |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1* | 1/2013 | Clark et al. ....................... 257/3 |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 10-2011-0014248 A | 2/2011 |
| WO | WO 03/034498 A1 | 4/2003 |
| WO | WO 2009/005699 A1 | 1/2009 |

OTHER PUBLICATIONS

Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Jian Hu et al., "Area-Dependent Switching in Thin Film-Silicon Devices", Materials Research Society Proceedings, 2003, pp. AI8.3.1-AI8.3.6, vol. 762, No. 1, Cambridge University Press.
Andre Dehon, "Array-Based Architecture for FET-Based, Nanoscale Electronics", IEEE Transactions on Nanotechnology, Mar. 2003, pp. 23-32, vol. 2, No. 1.
Herb Goronkin et al., "High-Performance Emerging Solid-State Memory Technologies", MRS Bulletin, Nov. 2004, pp. 805-813, www.mrs.org/publications/bulletin.
Gerhard Muller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North-Holland Publishing Company.
J. Campbell Scott, "Is There an Immortal Memory?", www.sciencemag.org, Apr. 2, 2004, pp. 62-63, vol. 304, No. 5667.
S.H. Lee et al., "Full Integration and Cell Characteristics for 64Mb Nonvolatile PRAM", 2004 Symposium on VLSI Technology Digest of Technical Papers, pp. 20-21, 2004 IEEE.
Stephen Y. Chou et al., "Imprint Lithography With 25-Nanometer Resolution", Science, Apr. 5, 1996, pp. 85-87, vol. 272.
S. Zankovych et al., "Nanoimprint Lithography: Challenges and Prospects", Institute of Physics Publishing, Nanotechnology 12, 2001, pp. 91-95.

(56) References Cited

OTHER PUBLICATIONS

A. Avila et al., "Switching in Coplanar Amorphous Hydrogenated Silicon Devices", Solid-State Electronics 44, 2000, pp. 17-27.
Jian Hu et al., "Switching and Filament Formation in Hot-Wire CVD P-Type A-Si:H Devices", Science Direct, Thin Solid Films 430, 2003, pp. 249-252, www.sciencedirect.com.
S. Hudgens et al,. "Overview of Phase-Change Chalcogenide Nonvolatile Memory Technology", MRS Bulletin, Nov. 2004, pp. 829-832, www.mrs.org/publications/bulletin.
K. Terabe et al., "Quantized Conductance Atomic Switch", Nature, vol. 433, Jan. 6, 2005, pp. 47-50, www.nature.com/ nature.
Michael Kund et al., "Conductive Bridging RAM (CBRAM): An Emerging Non-Volatile Memory Technology Scalable to Sub 20nm", IEEE, 2005.
W. Den Boer, "Threshold Switching in Hydrogenated Amorphous Silicon", American Institute of Physics, 1982, pp. 812-813.
P.G. Lecomber et al., "The Switching Mechnism in Amorphous Silicon Junctions", Journal of Non-Crystalline Solids 77 & 78, 1985, pp. 1373-1382, North-Holland, Amsterdam.
A. E. Owen et al., "Switching in Amorphous Devices", Int. J. Electronics, 1992, pp. 897-906, vol. 73, No. 5.
M. Jafar et al., "Switching in Amorphous-Silicon Devices", The American Physical Society, 1994, pp. 611-615, vol. 49, No. 19.
Stikeman, Alexandra, "Polymer Memory—The Plastic Path to Beller Data Storage," Technology Review, Sep. 2002, p. 31, www.technology review.com.
Yong Chen et al. "Nanoscale molecular-switch crossbar circuits," Nanotechnology 14, 2003, pp. 462-468, vol. 1.14, Institute of Physics Publishing.
C.P. Collier et al. "Electronically Configurable Molecular-Based Logic Gates," Science, Jul. 16, 1999, pp. 391-395, vol. 285, No. 5426.
Office Action for U.S. Appl. No. 11/875,541, dated Jul. 22, 2010.
Office Action for U.S. Appl. No. 11/875,541, dated Mar. 30, 2011.
Office Action for U.S. Appl. No. 11/875,541, dated Oct. 5, 2011.
Office Action for U.S. Appl. No. 11/875,541, dated Jun. 8, 2012.
Sung-Hyun Jo et al., "A Silicon-Based Crossbar Ultra-High-Density Non-Volatile Memory", SSEL Annual Report 2007.
International Search Report for PCT/US2009/060023, filed on Oct. 8, 2009.
Waser, R et al., "Nanoionics-based Resistive Switching Memories", Nature Materials, Nov. 2007, pp. 833-835, vol. 6.
Written Opinion of the International Searching Authority for PCT/US2009/060023, filed on Oct. 8, 2009.
Ex Parte Quayle Action for U.S. Appl. No. 12/826,653, dated May 8, 2012.
International Search Report for PCT/US2011/040090, filed on Jun. 10, 2011.
Written Opinion of the International Searching Authority for PCT/US2011/040090, filed on Jun. 10, 2011.
Notice of Allowability for U.S. Appl. No. 13/158,231, dated Apr. 17, 2012.
Office Action for U.S. Appl. No. 12/835,704, dated Sep. 21, 2011.
Office Action for U.S. Appl. No. 12/835,704, dated Mar. 1, 2012.
Advisory Action for U.S. Appl. No. 12/835,704, dated Jun. 8, 2012.
International Search Report and Written Opinion for PCT/US2011/046035, filed on Jul. 29, 2011.
Office Action for U.S. Appl. No. 12/861,650, dated Jan. 25, 2012.
Notice of Allowability for U.S. Appl. No. 12/861,650, dated Jun. 19, 2012.
Sung Hyun Jo et al., "Programmable Resistance Switching in Nanoscale Two-Terminal Devices," Supporting Information, Dec. 29, 2008, pp. 1-4, vol. 9. No. 1, Department of Electrical Engineering and Computer Science, The University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., Si-Based Two-Terminal Resistive Switching Nonvolatile Memory, 2008, IEEE.
Sung Hyun Jo et al., "Nanoscale Memristor Device as Synapse in Neuromorphic Systems", Nano Letters, 2010, pp. 1297-1301, pubs.acs.org/NanoLett, A-E, American Chemical Society Publications.
Wei Lu et al., "Nanoelectronics from the bottom up," Nature Materials—Review Articles | Insight, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices," 2006.
Sung Hyun Jo et al., "Experimental, Modeling and Simulation Studies of Nanoscale Resistance Switching Devices," 2009, IEEE.
Sung Hyun Jo et al., "Nonvolatile Resistive Switching Devices Based on Nanoscale Metal/Amorphous Silicon/Crystalline Silicon Junctions," Mater. Res. Soc. Symp. Proc., 2007, vol. 997, Materials Research Society.
Sung Hyun Jo et al., "Si Memristive Devices Applied to Memory and Neuromorphic Circuits."
Wei Lu et al., "Supporting Information," 2008.
Sung Hyun Jo et al., "High-Density Crossbar Arrays Based on a Si Memristive System," Nano Letters, 2009, pp. 870-874, vol. 9, No. 2, American Chemical Society Publications.
Sung Hyun Jo et al., "High-Density Crossbar Arrays Based on a Si Memristive System," Supporting Information, 2009, pp. 1-4.
Sung Hyun Jo et al., "Programmable Resistance Switching in Nanoscale Two Terminal Devices," Nano Letters, 2009, pp. 496-500, vol. 9, No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24, No. 10, JPN. J. Appl. Phys.
S. K. Dey, "Electrothermal model of switching in amorphous silicon films", J. Vac. Sci. Technol., Jan./Feb.1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids 115, 1989, pp. 168-170, Elsevier Science Publishers B.V., North-Holland.
A. Moopenn et al., "Programmable Synaptic Devices for Electronic Neural Nets", Control and Computers, 1990, pp. 37-40, vol. 18, No. 2.
P.G. Le Comber, "Present and Future Applications of Amorphous Silicon and Its Alloys", Journal of Non-Crystalline Solids 115, 1989, pp. 1-13, Elsevier Science Publishers B.V., North-Holland.
Hu, J., et. al. "AC Characteristics of Cr/p/sup +/ A-Si:HIV Analog Switching Devices." IEEE Transactions on Electron Devices, Sep. 2000, pp. 1751-1757, vol. 47, No. 9.
Owen, A.E. et al., "New amorphous-silicon electrically programmable nonvolatile switching device," Solid-State and Electron Devices, IEEE Proceedings I, Apr. 1982, pp. 51-54, vol. 129, No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures," Philosophical Magazine B, 1991, pp. 349-369, vol. 63, No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Dong, Y., et al., "Si/a-Si Core/Shell Nanowires as Nonvolatile Crossbar Switches", Nano Letters, Jan. 2008, pp. 386-391, vol. 8, No. 2.
European Search Report for Application No. EP 09 81 9890.6 of Mar. 27, 2012.
D. A. Muller, et al., "The Electronic Structure at the Atomic Scale of Ultrathin Gate Oxides", Nature, Jun. 1998, pp. 758-761, vol. 399, No. 24.
Sune, J. et al., "Nondestructive Multiple Breakdown Events in Very Thin SiO2 Films." Applied Physics Letters, 1989, vol. 55 No. 128.
Herve Marand, "Materials Engineering Science", MESc 5025, Chapter 7, University of Vermont, http://www.files.chem.vt.edu/chemdeptimarand/MEScchap6-1 c.pdf.

(56) References Cited

OTHER PUBLICATIONS

Owen, A.E. et al., "Electronic switching in amorphouse silicon devices: properties of the conducting filament", Proceedings of the 5th International Conference on Solid-State and Integrated Circuit Technology, 1998, pp. 830-833.
Jo, Sung Hyun, "Nanoscale Memristive Devices for Memory and Logic Applications", Thesis, University of Michigan, 2010.
Office Action for U.S. Appl. 12/894,098, dated Aug. 1, 2012.
Sung Hyun Jo et al., "CMOS Compatible Nanoscale Nonvolatile Resistance Switching Memory," Nano Letters, 2008, pp. 392-397, vol. 8, No. 2, American Chemical Society Publications.
Office Action for U.S. Appl. No. 12/582,086, dated Apr. 19, 2011.
Office Action for U.S. Appl. No. 12/582,086, dated Sep. 6, 2011.
Notice of Allowance for U.S. Appl. No. 12/582,086, dated Oct. 21, 2011.
International Search Report for PCT/US2009/061249, filed on Oct. 20, 2009.
Written Opinion of the International Searching Authority for PCT/US2009/061249, filed on Oct. 20, 2009.
Office Action for U.S. Appl. No. 12/861,650, dated Oct. 16, 2012.
Notice of Allowance for U.S. Appl. No. 12/894,087, dated Oct. 25, 2012.
Notice of Allowance for U.S. Appl. No. 13/149,807, dated Oct. 29, 2012.
Notice of Allowance for U.S. Appl. No. 12/861,666, dated Nov. 14, 2012.
Office Action for U.S. Appl. No. 13/156,232, dated Nov. 26, 2012.
Notice of Allowance for U.S. Appl. No. 13/290,024, dated Nov. 28, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 12/835,699, dated Aug. 24, 2011.
Notice of Allowance for U.S. Appl. No. 12/835,699, dated Feb. 6, 2012.
Office Action for U.S. Appl. No. 12/833,898, dated Apr. 5, 2012.
European Search Report for Application No. EP 1100 5207.3 of Oct. 12, 2011.
Notice of Allowance for U.S. Appl. No. 12/833,898, dated May 30, 2012.
Notice of Allowance for U.S. Appl. No. 12/939,824, dated May 11, 2012.
Notice of Allowance for U.S. Appl. No. 12/940,920, dated Oct. 5, 2011.
Office Action for U.S. Appl. No. 13/314,513, dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653, dated Apr. 25, 2012.
International Search Report for PCT/US2011/045124, filed on Jul. 22, 2011.
Written Opinion of the international Searching Authority for PCT/US2011/045124, filed on Jul. 22, 2011.
Peng-Heng Chang et al., "Aluminum spiking at contact windows in Al/Ti—W/Si", Appl. Phys. Let., Jan. 25, 1988, pp. 272-274, vol. 52 No. 4, American Institute of Physics.
J. Del Alamo et al., "Operating limits of Al-alloyed high-low junction for BSF solar cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 mailed Aug. 8, 2012.
Office Action for U.S. Appl. No. 13/417,135, dated Oct. 9, 2012.
Notice of Allowance for U.S. Appl. No. 13/532,019, dated Nov. 14, 2012.
Office Action for U.S. Appl. No. 13/149,653, dated Nov. 20, 2012.
Office Action of U.S. Appl. No. 13/436,714, dated Dec. 7, 2012.
Choi, Jang Wook, Bistable [2]Rotaxane Based Molecular Electronics: Fundamentals and Applications, Dissertation, May 17, 2007, pp. 79-124, California Institute of Technology, Pasadena, California.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 14/072,657, dated Jun. 17, 2014.

* cited by examiner

METHOD AND STRUCTURE OF MONOLITHICALLY INTEGRATED IC AND RESISTIVE MEMORY USING IC FOUNDRY-COMPATIBLE PROCESSES

CROSS-REFERENCES TO RELATED APPLICATIONS

The present application is a continuation-in-part of application Ser. No. 13/725,331 filed Dec. 21, 2012, which is a continuation of application Ser. No. 12/833,898 filed Jul. 9, 2010, now U.S. Pat. No. 8,374,018 issued Feb. 12, 2013.

BACKGROUND OF THE INVENTION

The present invention relates to monolithic techniques for integrating CMOS integrated circuit devices and solid state resistive devices used for memory storage. More particularly, some embodiments of the present invention provide methods and resulting devices including resistive memory devices and/or integrated circuits using standard IC foundry-compatible processes. Merely by way of example, embodiments of the invention can be applied to logic devices, PLD, processors, controllers, memories, and the like.

Resistive random-access memories (RRAMs) have generated significant interest recently as a potential candidate for ultra-high density non-volatile information storage. A typical RRAM device has an insulator layer provided between a pair of electrodes and exhibits electrical pulse induced hysteretic resistance switching effects.

The resistance switching has been explained by the formation of conductive filaments inside the insulator due to Joule heating and electrochemical processes in binary oxides (e.g. NiO and TiO2) or redox processes for ionic conductors including oxides, chalcogenides and polymers. Resistance switching has also been explained by field assisted diffusion of ions in TiO2 and amorphous silicon (a-Si) films.

In the case of a-Si structures, voltage-induced diffusion of metal ions into the silicon leads to the formation of conductive filaments that reduce the resistance of the a-Si structure. These filaments remain after the biasing voltage is removed, thereby giving the device its non-volatile characteristic, and they can be removed by reverse flow of the ions back toward the metal electrode under the motive force of a reverse polarity applied voltage.

Resistive devices formed by an a-Si structure provided between two metal electrodes have been shown to exhibit this controllable resistive characteristic. However, such devices typically have micron sized filaments which may prevent them from being scaled down to the sub-100 nanometer range. Such devices may also require high forming voltages that can lead to device damage and can limit production yields.

BRIEF SUMMARY OF THE INVENTION

The present invention relates to solid state resistive devices used for memory storage. More particularly, the present invention relates to integrating a resistive random access memory on top of an IC substrate monolithically using IC-foundry compatible processes (e.g. a CMOS compatible backend process). In various embodiments, the IC substrate is completed first using standard IC processes. An insulating layer, e.g. dielectric, oxide layer is then added on top of the IC substrate. Subsequent CMOS compatible processes then define a solid-state resistive device. In some embodiments, the solid-state resistive device may be formed using standing CMOS processes from a semiconductor foundry.

In an embodiment, a monolithic integrated circuit and resistive memory device is disclosed. An integrated circuit (IC) substrate is provided having one or more electronic devices formed upon a substrate. The electronic devices may include transistors. On top of the IC substrate, memory devices having a crossbar array structure are formed thereon using CMOS-compatible processes, i.e. IC foundry compatible processes. In various embodiments, the memory device comprises a first array of first electrodes extending along a first direction; a second array of second electrodes extending along a second direction, each second electrode having a polycrystalline semiconductor layer including silicon; a non-crystalline silicon structure provided between the first electrode and the second electrode at an intersection defined by the first array and the second array. Each intersection of the first array and the second array defines a two-terminal resistive memory cell. In some embodiments, the IC substrate may be formed at the same foundry as the foundry that forms the two-terminal resistive memory cell. In other embodiments, the IC substrate may be formed at a first semiconductor foundry, and the two-terminal resistive memory cell may be formed on top of the IC substrate at a second semiconductor foundry.

In another embodiment, the monolithic integrated circuit includes a resistive memory device where the non-crystalline silicon structure includes amorphous silicon, and the polycrystalline semiconductor layer includes a polycrystalline silicon-germanium.

In another embodiment, the monolithic integrated circuit includes a resistive memory device that includes a first electrode; a second electrode having a polycrystalline semiconductor layer that includes silicon; a noncrystalline silicon structure provided between the first electrode and the second electrode. The first electrode, second electrode and non-crystalline silicon structure define a two-terminal resistive memory cell.

In yet another embodiment, a method for fabricating a monolithic integrated circuit and resistive memory device includes the following steps. The method includes providing a first semiconductor substrate having a first surface region and forming one or more CMOS integrated circuit devices, e.g. transistors, logic, etc., overlying the first surface region. The CMOS integrated circuit device region has a CMOS surface region. A dielectric layer is formed overlying the CMOS surface region. The method includes: forming a bottom electrode over the CMOS surface region, the bottom electrode including a polycrystalline semiconductor layer that includes silicon; forming a switching medium over the bottom electrode, the switching medium defining a region wherein a filament is to be formed when a program voltage is applied; and forming a top electrode over the switching medium, the top electrode configured to provide at least part of metal particles needed to form the filament in the region defined in the switching medium. Interconnections may be formed between one or more CMOS integrated circuit devices and the top electrode and/or the bottom electrode. Using this architecture and fabrication flow, it is feasible and cost-effective to make an array of resistive memory devices on a single CMOS chip.

The details of one or more embodiments are set forth in the accompanying drawings and the description below. Other features, objects, and advantages will be apparent from the description and drawings, and from the claims.

As used herein, the term "nanoscale" or "nanostructure" refers to a structure having at least one dimension in the nanoscale range; for example, structures having a diameter or plural cross-sectional dimensions within the general range of 0.1 to 200 nanometers. This includes structures having all three spatial dimensions in the nanoscale; for example, a cylindrical nanocolumn or nanopillar having a length that is on the same order as its nanoscale diameter. Nanostructures can include the various nanoscale structures known to those skilled in the art; for example, nanotubes, nanowires, nanorods, nanocolumns, nanopillars, nanoparticles, and nanofibers.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

Figure 1:
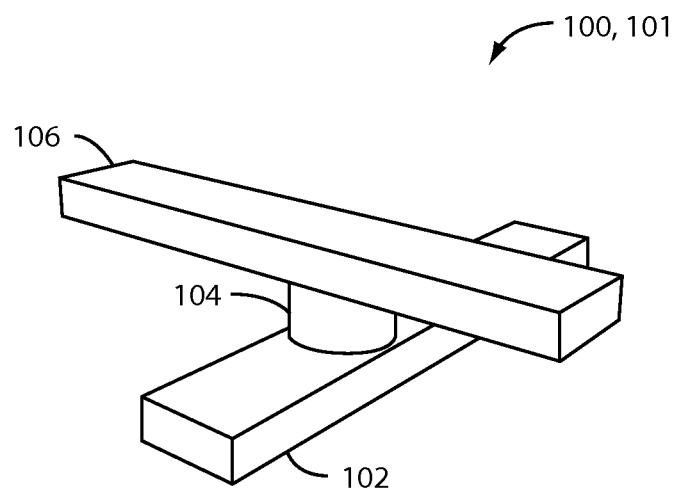
FIG. 1 illustrates a non-volatile solid state resistive device including a bottom electrode, a switching medium, and a top electrode according to an embodiment of the present invention.

FIG. 1 illustrates a memory cell 101 in a non-volatile solid state resistive device 100 including a bottom electrode 102, a switching medium 104, and a top electrode 106 according an embodiment of the present invention. Switching medium 104 exhibits a resistance that can be selectively set to various values, and reset, using appropriate control circuitry. Memory cell 101 is a two-terminal nanoscale resistive random-access memory (RRAM) in the present embodiment. Although not shown, one skilled in art would understand that device 100 includes a plurality of memory cells 101. One skilled in art would also appreciate that that memory cell 100 may be used as a programmable interconnect, variable capacitor or other types of devices.

RRAM is a two terminal memory having a switching medium provided between top and bottom electrodes. The resistance of the switching medium can be controlled by applying electrical signal to the electrodes. The electrical signal may be current-based or voltage-based. As used herein, the term "RRAM" or "resistive memory device" refers to a memory device (or memory cell) that uses a switching medium whose resistance can be controlled by applying electrical signal without ferro electricity, magnetization and phase change of the switching medium. For illustrative convenience, memory cell 101 and device 100 are referred collectively as "device 100" hereinafter unless the context makes it clear that the term refers solely to device 100.

In the present embodiment, device 100 is amorphous-silicon-based RRAM and uses amorphous silicon as switching medium 104. The resistance of the switching medium 104 changes according to formation or retrieval of a conductive filament inside the a-Si switching medium according to voltage applied. Top electrode 106 is a conductive layer containing silver (Ag) and acts as the source of filament-forming ions in the a-Si structure. Although silver is used in the present embodiment, it will be understood that the top electrode can be formed from various other suitable metals, such as gold (Au), nickel (Ni), aluminum (Al), chromium (Cr), iron (Fe), manganese (Mn), tungsten (W), vanadium (V), and cobalt (Co). Bottom electrode 102 is a boron-doped or other p-type polysilicon electrode 130 that is in contact with a lower end face of the a-Si structure.

Figure 2:
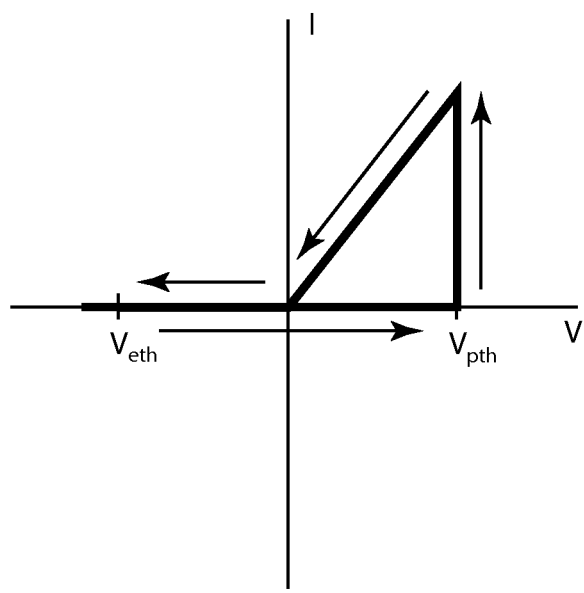
FIG. 2 illustrates resistance switching characteristics of device according to an embodiment of the present invention.

FIG. 2 illustrates resistance switching characteristics of device 100 according to an embodiment of the present invention. The switching medium displays a bipolar switching mechanism. The resistance of the switching medium changes depending on the polarity and magnitude of the signal applied to the switching medium via the top and bottom electrodes. The device is changed into ON-state (low resistance state) when a positive voltage equal to or greater than a program threshold voltage (or program voltage) Vpth is applied. In an embodiment, the program voltage ranges between 1 volts to 4 volts depending on the materials used for the switching medium and the top electrode. The device is switched back to OFF-state (high resistance state) when a negative voltage of equal or greater magnitude than erase threshold voltage (or erase voltage) Veth is applied. In an embodiment, the erase voltage ranges from −1 volts to −4 volts. The device state is not affected if the bias applied is between two threshold voltages Vpth and Veth, which enables the low-voltage read process. Once device 100 is set to a specific resistance state, the device retains the information for a certain period (or retention time) without electrical power, as explained in U.S. patent application Ser. No. 12/575,921, filed on Oct. 8, 2009, U.S. patent application Ser. No. 12/582,086, filed on Oct. 20, 2009, and U.S. patent application Ser. No. 12/814,410, filed on Jun. 11, 2010, which are all incorporated by reference in their entirety.

In an embodiment, device 100 illustrates a rectifying switching characteristic. Device 100 shows a diode-like behavior at ON-state so that the current in ON-state only flow at positive bias but not at negative bias. Device 100, however, remains in ON-state even though no current is detected as long as the applied negative voltage does not equal or exceed Veth.

Figure 3A:
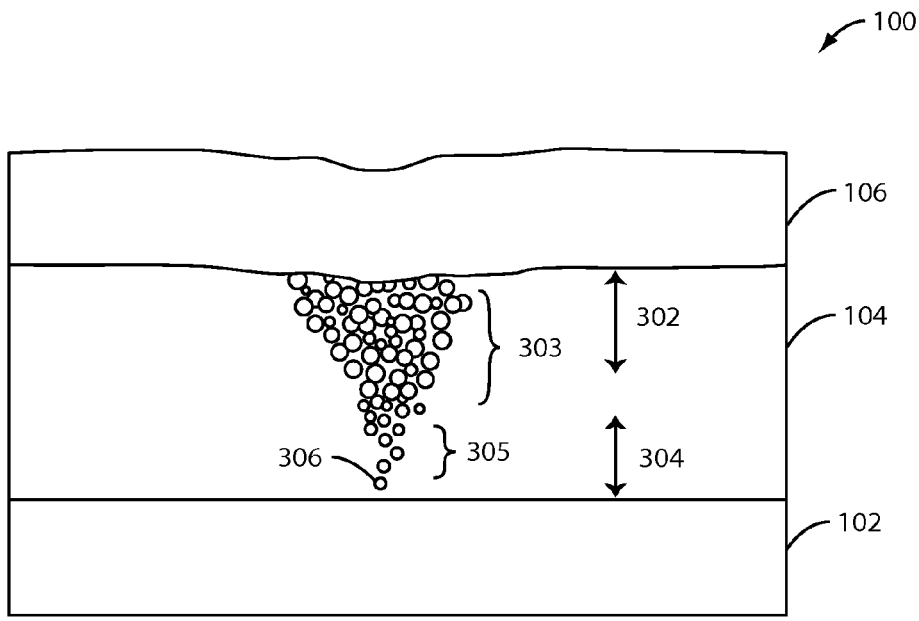
FIG. 3A illustrates a two-terminal device that is placed in an ON state by applying a program voltage Vpth to the top electrode.
Figure 3B:
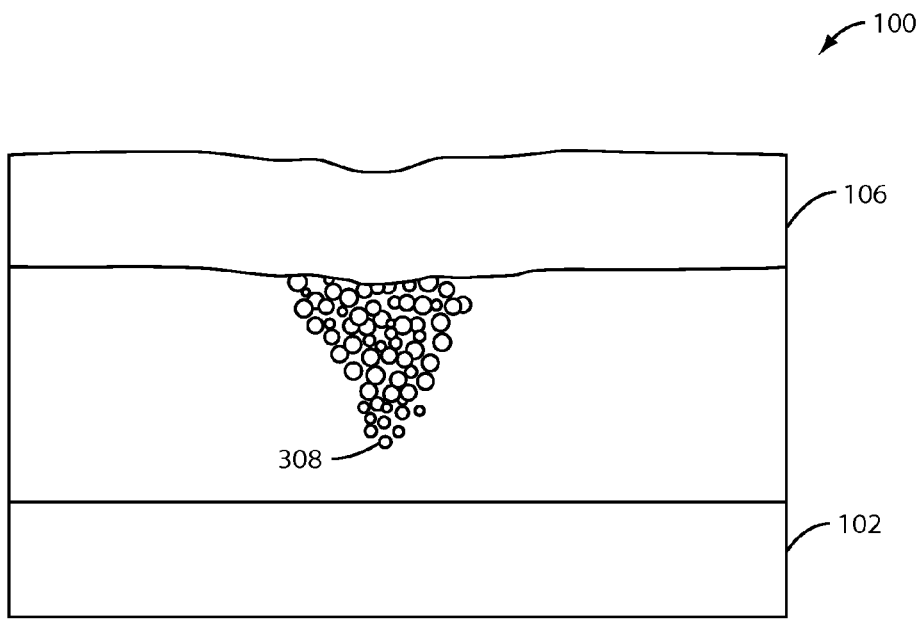
FIG. 3B illustrates a two-terminal device that is placed in an OFF state by applying an erase voltage Veth to the top electrode.

FIGS. 3A and 3B illustrate a switching mechanism of device 100 during ON and OFF states according to an embodiment of the present invention. The switching in an a-Si medium 104 is based on formation and retrieval of a nanoscale conductive filament (or a plurality of filaments) in a filament region in the a-Si medium according to the program and the erase voltages applied to the electrodes of device 100.

FIG. 3A illustrates device 100 that is placed in an ON state by applying a program voltage Vpth to the top electrode. Switching medium 104 made of a-Si is provided between bottom electrode 102 and top electrode 106. An upper portion of the switching medium includes a metallic region (or conductive path) 302 that extends from the top electrode to about 10 nm above the bottom electrode. Metallic region 302 is formed during an electro forming process when a slightly larger voltage (e.g., 3~5 volts), than a subsequent program voltage is applied to the top electrode. Alternatively, an extended voltage pulse (e.g., 100 μs to 1 s) may be applied to the top electrode to form the metallic region. This relatively large or voltage pulse causes the electric field induced diffusion of the metal ions from the top electrode toward the bottom electrode, thereby forming a continuous conductive path 303. A lower portion of the switching medium defines a filament region 304 wherein a filament 305 is formed when a program voltage Vpth is applied after the electroforming process. In certain implementations, the conductive path 303 and the filament 305 can be also formed together in a single step, e.g., during the electroforming process or when program voltage Vpth is applied. The filament comprises a series of metal particles that are trapped in defect sites in a lower portion of the switching medium when a program voltage applied provides sufficient activation energy to push a number of metal ions from metallic region 302 toward the bottom electrode.

Filament 305 is believed to be comprised of a collection of metal particles that are separated from each other by the non-conducting switching medium and does not define a continuous conductive path, unlike the path 303 in the metallic region. Filament 305 extends about 2-10 nm depending on implementation. The conduction mechanism in the ON state is electrons tunneling through the metal particles in the filament. The device resistance is dominated by the tunneling resistance between a metal particle 306 and the bottom electrode. Metal particle 306 is the metal particle in the filament region that is closest to the bottom electrode and is the last metal particle in the filament region in the ON state.

FIG. 3B illustrates device 100 that is placed in an OFF state by applying an erase voltage Veth to the top electrode. The erase voltage exerts sufficient electromagnetic force to dislodge the metal particles trapped in the defects sites of the a-Si and retrieves at least part of the filament from filament region 304. A metal particle 308 that is closest to the bottom electrode in the OFF state is separated from the bottom electrode by a greater distance than the metal particle 306 during the ON state. This increased distance between the metal particle 308 and the bottom electrodes places the device 100 in a high resistance state compared to the ON state.

In an embodiment, the resistance ratio between the ON/OFF states ranges from 10E3 to 10E7. Device 100 behaves like a resistor in the ON state and a capacitor in the OFF state (i.e., the switching medium does not conduct current in any meaningful amount and behaves as a dielectric in the OFF state). In an implementation, the resistance is 10E5 Ohm in the ON state and 10E10 Ohm in the OFF state. In another implementation, the resistance is 10E4 Ohm in the ON state and 10E9 Ohm in the OFF state. In yet another implementation, the resistance is at least 10E7 Ohm in the OFF state.

In an embodiment, device 100 exhibits controllable ON-state current flow of 10 nA-10 mA and endurance of greater 10E6. Device 100 exhibits relatively a retention time of 6 years at room temperature.

Figure 4:
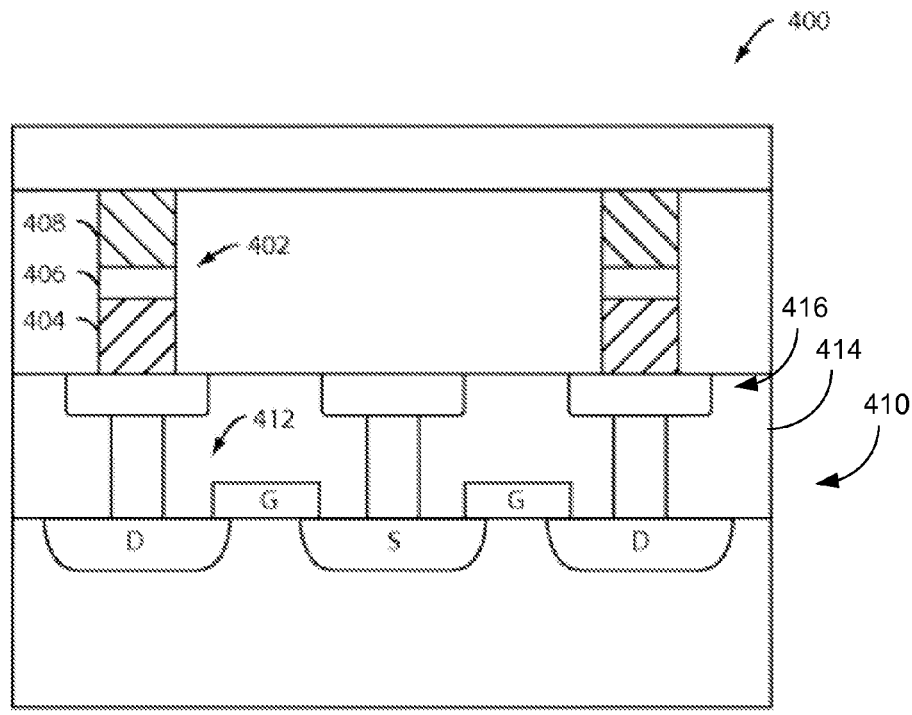
FIG. 4 illustrates a semiconductor device having a substrate with a CMOS device implemented in a frontend CMOS process and a two-terminal resistive memory implemented in a backend CMOS process according to an embodiment of the present invention.

FIG. 4 illustrates a semiconductor device 400 having a semiconductor substrate 410 including CMOS device, e.g. transistor 412, and a two-terminal resistive memory 402, implemented in a backend process according to an embodiment of the present invention. In various embodiments, resistive memory 402 is integrated with conventional CMOS circuitry, such as transistor 412, in one transistor-one-resistive-device (1T 1R) configuration. As illustrated, semiconductor substrate 410 includes a conventional dielectric material 414 with metal interconnects 416 formed therethrough that couple resistive memory 402 to transistor 412.

Resistive memory 402 includes a bottom electrode 404, a switching medium 406, and a top electrode 408. Switching medium 406 exhibits a resistance that can be selectively set to various values according to the voltages applied to the top and bottom electrodes 408, 404. Resistive memory 402 corresponds to memory cell 100 and in this example, is connected with a select transistor 412 in series. Select transistor 412 controls the location of the switching element to be accessed.

Figure 5:
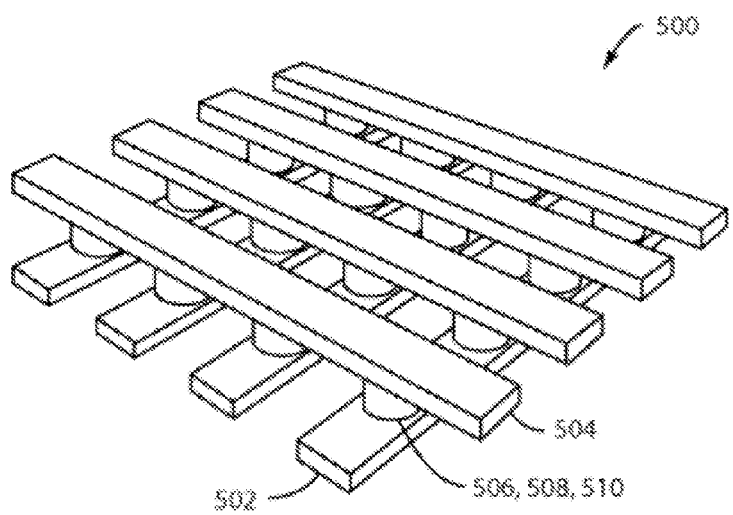
FIG. 5 illustrates two-terminal resistive memory cells arranged in a crossbar memory array according to an embodiment of the present invention.

FIG. 5 illustrates two-terminal resistive memory cells arranged in a crossbar memory array 500 according to an embodiment of the present invention. Crossbar memory array 500 is implemented in a backend CMOS compatible process, i.e. using standard IC foundry compatible processes. Metal interconnects, transistors, or other circuits including one or more other crossbar memory arrays may be formed below crossbar memory array 500 using standard IC foundry compatible processes.

Crossbar memory array 500 includes a parallel array of bottom electrodes 502 extending along a first direction. In an embodiment, bottom electrodes 502 includes a bottom metal (not shown) and a polycrystalline silicon-germanium (not shown) formed on the bottom metal. The bottom electrodes are nanoscale in the present embodiment. For example, the bottom electrodes have a width of about 40 nm and pitch of about 60 nm.

A parallel array of top electrodes 504 extends along a second direction to intersect the bottom electrodes. The top electrodes include metal capable of supplying filament forming ions such as silver (Ag), gold (Au), nickel (Ni), aluminum (Al), chromium (Cr), iron (Fe), manganese (Mn), tungsten (W), vanadium (V) and cobalt (Co). In an embodiment, the top electrodes and the bottom electrodes are orthogonal to each other. The top electrodes are nanowires having a width of about 60 nm and a pitch of about 150 nm.

Each intersection 506 of the two arrays defines a two-terminal resistive memory cell 508. Examples of cell 508 include two-terminal device 100 shown in FIG. 1 and two terminal devices 600 and 650 shown in FIG. 6A and 6B. The memory cell at each intersection 506 includes two electrodes separated by a switching layer 510. In the present embodiment, the switching layer includes amorphous silicon or other non-crystalline silicon. The switching structure can be the same width or narrower than the bottom electrode. In some embodiments, each memory cell in a crossbar memory array can store a single bit. In other embodiments, the memory cells exhibit multi-level resistance thereby allowing storage of a plurality of bits at each cell.

The crossbar memory array as described above may be fabricated on a silicon substrate, as illustrated in FIG. 4, in an embodiment. In another embodiment, III-V type semiconductor compounds (such as Gallium Arsenide GaAs, Gallium Nitride GaN, Boron Nitride BN etc.) or II-VI type semiconductor compounds (such as Cadmium Selenide, Zinc Telluride etc.) may also be used as the substrate.

Figure 6A:
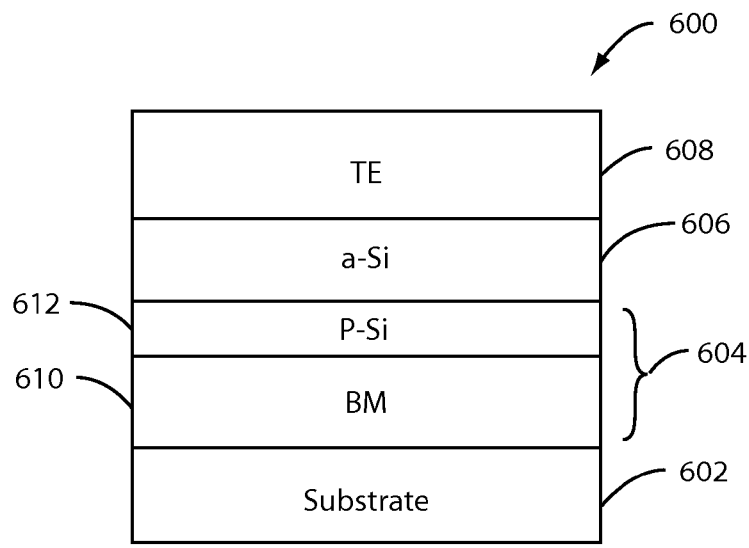
FIG. 6A illustrates a nanoscale non-volatile solid state resistive memory having a polysilicon layer as part of a bottom electrode according to an embodiment of the present invention.

FIG. 6A illustrates a nanoscale non-volatile solid state resistive memory 600 having a polysilicon layer as part of a bottom electrode according to an embodiment of the present invention. Resistive memory 600 is a two-terminal RRAM in the present embodiment. Resistive memory 600 includes a bottom electrode 604, a switching layer 606, and a top electrode 608. Resistive memory 600 is formed over a substrate

602. In an embodiment, substrate 602 is a semiconductor substrate, e.g., a silicon substrate or a compound substrate of a III-V or II-VI type, having CMOS devices formed therein, as illustrated in FIG. 4. In an embodiment, the substrate is not made of semiconductor material, e.g., is made of plastic.

Bottom electrode 604 includes a bottom metal layer 610 formed on a substrate and a p-type polysilicon layer 612 formed on the bottom metal layer. The p-type polysilicon layer has a thickness of 10~30 nm, and the bottom metal layer has a thickness of about 150 nm according to an implementation. The thicknesses of these layers may vary depending on implementation. In the present embodiment, p-type polysilicon layer 612 is a boron-doped polysilicon, and bottom metal layer 610 is made of metal, e.g., tungsten, aluminum or copper, or an alloy thereof. In an implementation, the bottom metal is replaced with non-metal material that has a higher conductivity than the p-type polysilicon layer.

P-type polysilicon 612 facilitates the defect site formation in the a-Si switching medium to be controllable by enabling the tuning of the amorphous silicon deposition on the p-type polysilicon, so that the defect density in the filament region does not become too high. When metal, e.g., Nickel or other metal, is used as a platform whereon the amorphous silicon switching layer is formed, the inventors have found that the filament formation was difficult to control due to the excess number of defect sites formed at the a-Si/metal interface. Furthermore, a-Si can react with the bottom metal electrode during the a-Si deposition, giving a-Si and metal alloy (silicide) at the interface. Accordingly, in addition to serving as an electrode, p-type polysilicon 612 serves as a platform that enables defect formation in the aSi switching layer to be controllable, e.g. layer 612 is an interface layer.

One issue associated with the use of polysilicon as part of bottom electrode 604 is the relatively high deposition temperature needed for polysilicon. Typically, polysilicon is deposited by pyrolyzing silane (SiH4) at 580 to 650° C. and the dopants provided therein are activated at 800° C. or higher temperature. However, a CMOS compatible backend process preferably should have thermal budget of 450° C. to limit damage or degradation of the existing structures (underlying CMOS devices, e.g. transistor 412). For example, if exposed to high temperature, aluminum interconnect may be degraded due to its low melting temperature. The relatively high deposition temperature of polysilicon can limit the use of resistive memory 600 in a backend process. Reducing the polysilicon deposition temperature to 450° C. or less, however, may hinder crystal formation and cause the resulting material to have undesirably high resistance. In addition, lowering the temperature decreases the deposition rate of polysilicon significantly and could make the fabrication process impractical.

Figure 6B:
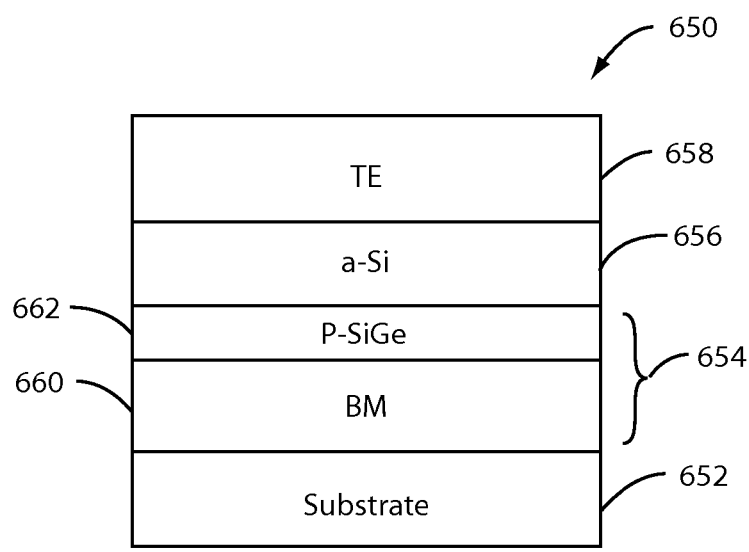
FIG. 6B illustrates a nanoscale non-volatile solid state resistive memory having a polycrystalline silicon-germanium (poly-SiGe) layer as part of a bottom electrode according to an embodiment of the present invention.

FIG. 6B illustrates a nanoscale non-volatile solid state resistive memory 650 having a polycrystalline semiconductor layer, e.g., a polycrystalline silicon-germanium layer, as part of a bottom electrode according to an embodiment of the present invention. The polycrystalline semiconductor layer comprises material that can be deposited at a low temperature. One example such a polycrystalline semiconductor layer is polycrystalline silicon-germanium (poly-SiGe). Poly-SiGe can be deposited at a lower temperature than polysilicon because the low transition temperature from amorphous to polycrystalline of SiGe. In addition, boron doping has also been found to enhance the crystallization which further lowers the crystallization temperature. Poly-SiGe can be used to bring the thermal budget for deposition to be 450° C. or less, e.g., 400° C., and allow resistive memory 650 to be implemented more easily with a conventional CMOS technology. In other words, embodiments of the present invention, can be formed using IC foundry-compatible processes. Resistive memory 650 is an RRAM in the present embodiment, but may be other types of device in other embodiments.

Resistive memory 650 includes a bottom electrode 654, a switching layer 656, and a top electrode 658. Switching layer 656 is provided between the top and bottom electrodes and includes a-Si material whose resistance can be made to vary according to voltages applied. Resistive memory 650 is formed over a substrate 652. Substrate 652 maybe a semiconductor substrate, e.g., a silicon substrate or a compound substrate of a III-V or II-VI type. In an embodiment, the substrate is not made of semiconductor material, e.g., is made of plastic.

In an embodiment, resistive memory is formed in a back-end process. Accordingly, substrate 652 may include transistors, metal interconnects, and other circuits so that resistive memory 650 overlies one or more of these circuit components. Because these are formed before the resistive memory, these are termed herein as front-end CMOS processes.

In an embodiment, bottom electrode 654 includes a bottom metal layer 660 formed on a substrate and a polycrystalline semiconductor layer (e.g., poly-SiGe layer) 662 (e.g. an interface layer) formed on the bottom metal layer. Poly-SiGe layer 662 has a thickness of 10 30 nm, and bottom metal layer 660 has a thickness of about 150 nm according to an implementation. The thicknesses of these layers may vary depending on implementation. Poly-SiGe layer 662 is boron-doped, and bottom metal layer 660 is made of metal, e.g., tungsten, aluminum or copper, or an alloy thereof. In an implementation, the bottom metal is replaced with nonmetal material that has a higher conductivity than the poly-SiGe layer.

Poly-SiGe 662 film exhibits many properties comparable to polysilicon. Like polysilicon, poly-SiGe 662 facilitates the defect site formation in the a-Si switching medium, so that the defect density in the filament region does not become too high. In addition to poly-SiGe, the polycrystalline semiconductor layer may include III-V type semiconductor compounds (such as Gallium Arsenide GaAs, Gallium Nitride GaN, Boron Nitride BN etc.) or II-VI type semiconductor compounds (such as Cadmium Selenide, Zinc Telluride etc.).

Switching layer 656 exhibits a resistance that can be selectively set to various values, and reset, using appropriate control circuitry. In an embodiment, switching layer 656 includes an a-Si structure having a thickness of 20-80 nm. The thickness of the amorphous silicon structure varies depending on the device size and configuration. In an embodiment, the a-Si structure is a film wherein the width and length are substantially greater than the thickness. Alternatively, the a-Si structure may be a pillar wherein the vertical dimension is more pronounced than the dimensions of width and length.

In an embodiment, switching layer 656 includes non-crystalline silicon structures, such as amorphous polysilicon (sometimes called nanocrystalline silicon, an amorphous phase that includes small grains of crystalline silicon). As used herein, the term "noncrystalline silicon" refers to amorphous silicon or amorphous poly-SiGe that exhibits controllable resistance, a combination thereof, or the like.

Top electrode 658 contains silver (Ag) as the source of filament-forming metal ions in the switching medium. In an embodiment, top electrode 658 includes an Ag film with a thickness of 150 nm. In other embodiments, the top electrode includes a stacked structure. For example, a Ag layer of about 50 nm is deposited on top of a-Si and another metal (e.g., TiN/W) of about 100 nm can be deposited on top of the Ag layer. The thickness may vary depending on the device size and implementation. Although silver is used in the present embodiment, it will be understood that the top electrode can be formed from various other suitable metals, such as gold (Au), nickel (Ni), aluminum (Al), chromium (Cr), iron (Fe), manganese (Mn), tungsten (W), vanadium (V), cobalt (Co) or a metal stack (or stacks).

Figure 7A:
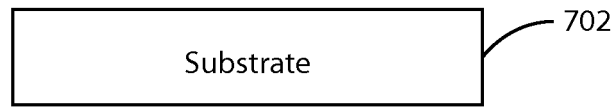
FIGS. 7A-7E illustrate a process for forming a resistive memory according to an embodiment of the present invention.

FIGS. 7A-7E illustrate a process for forming a monolithically integrated device including integrated circuits and resistive memory, e.g., resistive memory cell 650, according to an embodiment of the present invention. FIG. 7A illustrates a simplified cross section diagram of components of a starting substrate 702 whereon a plurality of resistive memories is to be defined (FIG. 7A) various embodiments, substrate 702 may be a prime grade silicon substrate in the present embodiment. In other embodiments, other semiconductor materials such as III-V and II-VI type semiconductor compounds may be used as the substrate. Resistive memory cell 650 may be formed as part of a front-end process (e.g. before IC devices are formed) or a back-end process (e.g. after IC devices are formed on the IC substrate) depending on implementation. If used in a backend process, substrate 702, may include one or more layers of material formed and patterned thereon when the substrate is provided for the present process. For example in some embodiments, upon a starting substrate, a plurality of devices, such as transistor 412 (FIG. 4) are formed thereon, and then a dielectric layer such as oxide and/or nitride layer is deposited on top of a top metal layer of the IC wafer, as also sown in FIG. 4. In some embodiments, the dielectric layer is then patterned to form IC substrate 702, as illustrated.

Figure 7B:
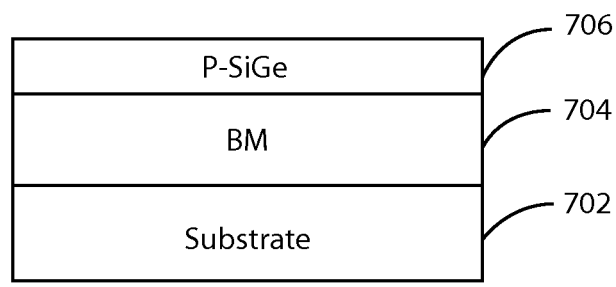

A bottom metal layer 704 is formed over substrate 702 (FIG. 7B). One purpose of the bottom metal is to minimize the resistance of the bottom electrode to be formed. The bottom metal may not be needed in certain implementations. For example, as illustrated in FIG. 4, a bottom metal may be formed as part of IC substrate 420. The bottom metal can be gold (Au), nickel (Ni), aluminum (Al), chromium (Cr), iron (Fe), manganese (Mn), tungsten (W), vanadium (V), cobalt (Co), platinum (Pt), titanium nitride (TiN) or a stack (or stacks) of metals. The bottom metal may comprise metal having a high voltage threshold for ion migration (e.g., higher than that of the metal used for the top electrode).

An interface layer, e.g. polycrystalline semiconductor layer (e.g., poly-SiGe layer) 706 is formed over bottom metal layer 704 to define the bottom electrode having the bottom metal and the polycrystalline semiconductor layer (FIG. 7B). In some embodiments, the polycrystalline semiconductor layer (or poly-SiGe) is a p-type and has high doping concentration of $10E17$~$10E21/cm^3$. In an embodiment, the poly-SiGe has a doping concentration of at least $1E20/cm^3$, e.g., about 5 $E20/cm^3$. Poly-SiGe layer 706 may be doped with acceptors such as Boron (B) or Aluminum (Al). A certain amount of silicon within poly-SiGe layer 706 enables the formation of a-Si thereon to be controllable so that the defect density in the filament region does not become too high. Increasing the concentration of Ge, however, results in lower deposition temperature which is desirable when implementing or integrating resistive memory 650 in a CMOS compatible backend process. In an embodiment, the Ge concentration in poly-SiGe 706 is 60-95%. In another embodiment, the Ge concentration is 75-80%. In yet another embodiment, the Ge concentration is about 70%.

Poly-SiGe 706 layer is deposited over the bottom electrode at a relatively low temperature of 450° C. or less, e.g., 380-420° C., so that the formation of resistive memory 650 may be implemented in a CMOS compatible back-end process on IC substrate 702.

In an embodiment, poly-SiGe layer 706 is deposited by using a low pressure chemical vapor deposition (LPCVD) process at a chamber pressure of 2 Torr, at 400° C. The deposition temperature is lowered by increasing the concentration of Ge, so that the resulting poly-SiGe has the Ge concentration of about 70%. Gases input into the process chamber include: diborane (1%, H2 balance) at 10 sccm, SiH4 at 7 sccm, and GeH4 (10%) at 40 sccm. P-type impurities are doped into poly-SiGe by in-situ doping using B2H6 or BCh, or both. In various embodiments, the process for forming the interface layer is also compatible with IC foundry compatible processes.

In addition to LPCVD, other deposition techniques may also be used to deposit poly-SiGe over the bottom electrode, e.g., atmospheric pressure CVD (APCVD), ultra-high vacuum CVD (UHVCVD), aerosol assisted CVD (AACVD), plasma enhanced CVD (PECVD), microwave plasma assisted CVD (MPCVD), atomic layer CVD (ALCVD) or atomic layer epitaxy, hybrid physical-chemical vapor deposition (HPCVD), hot wire CVD (HWCVD), direct liquid injection CVD (DLICVD) and vapor phase epitaxy (VPE).

Figure 7C:
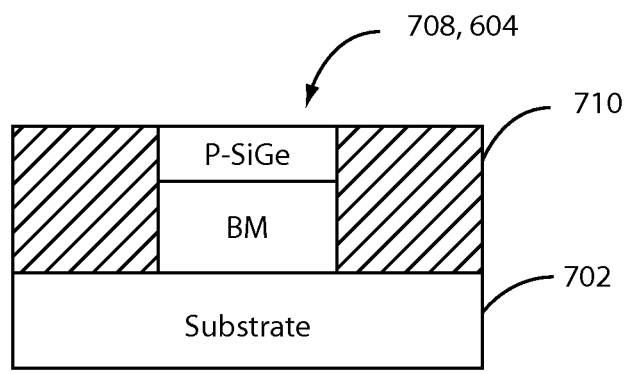

Referring to FIG. 7C, bottom metal 704 and p-type poly-SiGe 706 are patterned to obtain a bottom electrode 708 (corresponding to bottom electrode 604 of device 650) extending along a direction (e.g., horizontal direction). Although not shown, a plurality of bottom electrodes 708 extending along the direction in parallel is formed at this step. An insulating layer f5 is formed over the patterned bottom electrode and then planarized to expose the p-type poly-SiGe layer. Insulating layer 710 is silicon dioxide in an embodiment.

Figure 7D:
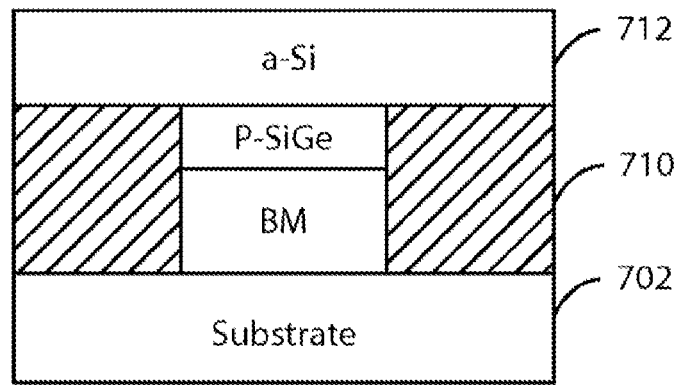

An amorphous silicon layer 712 is formed on the p-type poly-SiGe to a thickness of 2-30 nm (FIG. 7D). The a-Si layer defines a switching medium wherein a filament will be formed when a program voltage is applied to place the resistive memory in ON state. In an embodiment, the defect density of a-Si layer 712 may be increased to enable more metal particles to be trapped therein, thereby increasing the retention time and lowering the ON resistance of the device. For example, a-Si layer 712 may be provided with a relatively high defect density region provided proximate the bottom electrode and a relatively low defect density region provided proximate the top electrode.

Figure 7E:
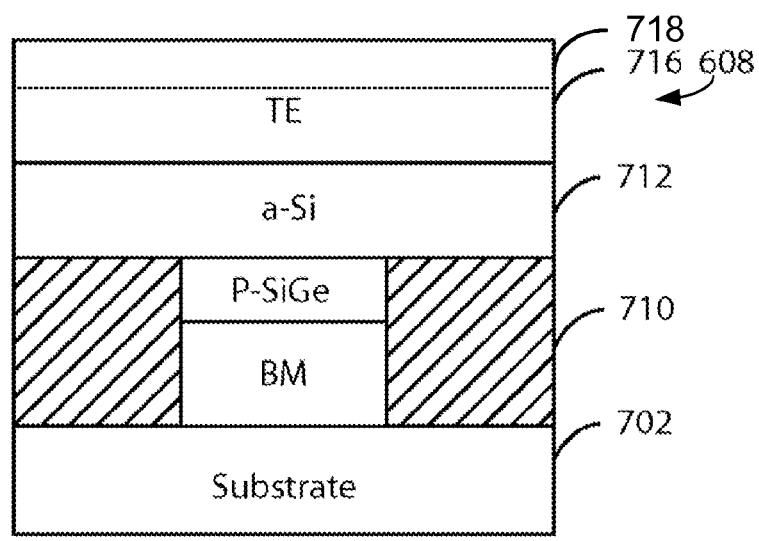

Referring to FIG. 7E, a filament-forming-ion-supplying metal layer (or top electrode) 716 is formed over the a-Si layer. In the present embodiment, metal layer 716 includes silver. In other embodiments, metal layer 716 may include gold (Au), nickel (Ni), aluminum (Al), chromium (Cr), iron (Fe), manganese (Mn), tungsten (W), vanadium (V) and cobalt (Co). Palladium (Pd), Titanium nitride (TiN) or other materials 718, may be deposited over silver layer 716 as a passivation layer. The metal layer is patterned to form a top electrode (see top electrode 504 of device 500). The top electrode extends along a direction (e.g., a vertical direction in and out of the page) to form an angle with the bottom electrode, e.g., 90 degrees. Although not shown, resistive memory 650 includes a plurality of top electrodes extending along a first direction and a plurality of bottom electrodes 402 extending along a second direction to define a plurality of intersections. Each intersection defines a two-terminal resistive memory 650.

A number of embodiments have been described. Nevertheless, it will be understood that various modifications may be made without departing from the spirit and scope of the invention. For example, the ordering of layers on the substrate could be reversed, where the top electrode is provided below the bottom electrode depending on implementation. Accordingly the terms "top" and "bottom" should not be used to limit the relative positions of the source electrode that provides the filament-forming ions in the a-Si structure and an electrode provided at its opposing side. Accordingly, other embodiments are within the scope of the following claims.

What is claimed is:

1. A monolithic integrated circuit and crossbar array comprising:
   a semiconductor substrate having a first surface region;
   one or more CMOS integrated circuit devices provided on the surface region of the semiconductor substrate;
   a dielectric layer overlying the one or more CMOS integrated circuit devices;
   a first plurality of electrodes overlying the dielectric layer and extending along a first direction;
   a second plurality of electrodes overlying the first plurality of electrodes and extending along a second direction, wherein the first direction and the second direction are different; and
   wherein intersections of the first plurality of electrodes and the second plurality of electrodes define a two-terminal resistive memory cell comprising:
      a resistive switching material having a controllable resistance;
      an interface material disposed between the resistive switching material and the first plurality of electrodes, wherein the interface material comprises a foundry-compatible p-doped polycrystalline silicon germanium—containing material; and
      an active metal material disposed between the resistive switching material and the second plurality of electrodes.

2. The monolithic integrated circuit and crossbar array of claim 1, wherein the resistive switching material comprises amorphous silicon.

3. The monolithic integrated circuit and crossbar array of claim 2,
   wherein the resistive switching material comprises a nano-pillar structure disposed between first plurality of electrodes and the second plurality of electrodes;
   wherein the active metal material is selected from a group consisting of: silver (Ag), gold (Au), nickel (Ni), aluminum (Al), chromium (Cr), iron (Fe), manganese (Mn), tungsten (W), vanadium (V) and cobalt (Co).

4. The monolithic integrated circuit and crossbar array of claim 1, wherein the polycrystalline silicon-germanium material has a concentration within a range of about 60% Ge to about 80% g Ge.

5. The monolithic integrated circuit and crossbar array of claim 1,
   wherein the polycrystalline silicon-germanium-containing material has a concentration within a range of about 70% Ge to about 80% Ge; and
   wherein the polycrystalline silicon-germanium-containing material is formed by using a deposition temperature within a range of about 380° C. to about 420° C.

6. The monolithic integrated circuit and crossbar array of claim 1, wherein the polycrystalline silicon-germanium-containing material is deposited at a temperature of about 400° C.

7. The monolithic integrated circuit and crossbar array of claim 1, wherein the polycrystalline silicon-germanium-material is doped with boron with a doping concentration within a range of about $10E17/cm^3$ to about $10E20/cm^3$.

8. The monolithic integrated circuit and crossbar array of claim 1, wherein the resistive switching material is configured to have a ratio of an on resistance to off resistance within a range of about 10E3 to about 10E7.

9. The monolithic integrated circuit and crossbar array of claim 1, wherein the one or more CMOS integrated circuit devices provided on the surface region of the semiconductor substrate comprises a MOS transistor.

10. The monolithic integrated circuit and crossbar array of claim 1 further comprising a plurality of electrical contacts between the one or more CMOS integrated circuit devices and the first plurality of electrodes.

11. A method for forming an integrated circuit comprising:
    receiving a semiconductor substrate having one or more CMOS integrated circuit devices formed on a surface region of the semiconductor substrate;
    forming a dielectric layer overlying the one or more CMOS integrated circuit devices;
    forming a first plurality of electrodes overlying the dielectric layer and extending along a first direction;
    forming a second plurality of electrodes overlying the first plurality of electrodes and extending along a second direction, wherein the first direction and the second direction are different; and
    forming a two-terminal resistive memory cell at intersections of the first plurality of electrodes and the second plurality of electrodes using foundry-compatible processes, comprising:
       forming a resistive switching material having a controllable resistance;
    disposing an interface material between the resistive switching material and the first plurality of electrodes, wherein the interface material comprises p-doped polycrystalline silicon germanium—containing material; and
    disposing an active metal material between the resistive switching material and the second plurality of electrodes.

12. The method of claim 11, wherein the forming the resistive switching material comprises depositing amorphous silicon material.

13. The method of claim 12,
    wherein the forming the resistive switching material further comprises: forming a nano-pillar structure between the first plurality of electrodes and the second plurality of electrodes;
    wherein the active metal material is selected from a group consisting of: silver (Ag), gold (Au), nickel (Ni), aluminum (Al), chromium (Cr), iron (Fe), manganese (Mn), tungsten (W), vanadium (V) and cobalt (Co).

14. The method of claim 11, wherein the polycrystalline silicon-germanium material has a concentration within a range of about 60% Ge to about 80% g GE.

15. The method of claim 12 wherein forming the polycrystalline silicon-germanium-containing material comprises depositing the polycrystalline silicon germanium-containing material at a deposition temperature within a range of about 380° C. to about 420° C.

16. The method of claim 11 wherein the disposing the interface material comprises doping the polycrystalline silicon germanium-containing material with boron with a doping concentration within a range of about $10E17/cm^3$ to about $10E20/cm^3$.

17. The method of claim 11, wherein the resistive switching material comprises an electric field controllable resistance via metal ion migration.

18. The method of claim 11 wherein the receiving the semiconductor substrate comprises:
    receiving the semiconductor substrate having the surface region; and
    forming the one or more CMOS integrated circuit devices on the surface region using foundry-compatible processes.

19. The method of claim 18 wherein the forming the one or more CMOS integrated circuit devices comprises forming a MOS transistor on the surface region.

20. The method claim 11 further comprising forming a plurality of electrical contacts between the one or more CMOS integrated circuit devices and the first plurality of electrodes.

\* \* \* \* \*